United States Patent [19]

Lomashevich

[11] Patent Number: 5,717,225

[45] Date of Patent: Feb. 10, 1998

[54] NONLINEAR OPTICAL TRANSISTOR

[75] Inventor: Svyatoslav A. Lomashevich, Sankt Petersburg, Russian Federation

[73] Assignee: Samsung Electronics Co., Ltd., Suwon, Rep. of Korea

[21] Appl. No.: 278,192

[22] Filed: Jul. 21, 1994

[30] Foreign Application Priority Data

Jul. 21, 1993 [RU] Russian Federation ............. 93037054

[51] Int. Cl.$^6$ .......................... H01L 31/12; H01L 33/00; H01L 27/15; H01S 3/18

[52] U.S. Cl. .................. 257/84; 257/85; 257/98; 372/45; 372/94; 359/248

[58] Field of Search .................. 372/45, 94; 257/84, 257/85, 98; 359/248

[56] References Cited

U.S. PATENT DOCUMENTS

5,001,523  3/1991  Lomashevich et al. ................. 357/19
5,260,586  11/1993  Kondoh .................................. 257/85

OTHER PUBLICATIONS

S. Kinoshita and K. Iga, "Circular Buried Heterostructure (CBH) GaAlAs/GaAs Surface Emitting Lasers", *IEEE J. of Electronics* QE-23(6):882–888 (Jun. 1987).

S.A. Lomashevich and Y.L. Bystrov, "Optical Transistor Concepts", Linaks Scientific–Technical Center, Leningrad; translated from *Zhurnal Prikladnoi Spektroskopii* 55(3):485–490 (Sep. 1991), original article submitted Feb. 12, 1991.

F.A.P. Tooley et al., "High gain signal amplification in an InSb transphasor at 77 K", *Appl. Phys. Lett* 43(9):807–809 (Nov. 1, 1983).

*Primary Examiner*—Jerome Jackson
*Attorney, Agent, or Firm*—Cushman Darby & Cushman IP Group of Pillsbury Madison & Sutro LLP

[57] ABSTRACT

A nonlinear optical transistor comprises a pair of surface emitting semiconductor laser diodes, a phase modulator including a waveguide confined by a pair of first mirrors in the horizontal direction and located between the pair of surface emitting semiconductor laser diodes and a multiplicity of electrodes for controlling these elements. The transistor is characterized by its input optical signals for controlling the system; its high sensitivity; its capability to generate narrow, circularly symmetrical and single mode output signals; and its ability to carry out a multi-level processing of optical signals as well as computing operations and storage functions. These characteristics are obtained by introducing a pair of Fabry-Perot microresonators, each of the Fabry-Perot microresonators having a vertical optical axis, by utilizing a plurality of multilayer Bragg reflectors, wherein surface coatings are applied to the input faces to increase the reflection index to 1.0, the grating of the distributed Bragg reflectors being located above the phase modulator waveguide and the reference electrode being found on the bottom bases. The device has two input and two output optical contacts.

13 Claims, 8 Drawing Sheets

NONLINEAR OPTICAL TRANSISTOR

FIELD OF THE INVENTION

The present invention relates to an optical device; and, more particularly, to a nonlinear optical transistor capable of performing amplification, commutation, communication and computing of optical signals.

BACKGROUND OF THE INVENTION

There has been a growing demand for devices made of all-optical components for performing such functions as amplification, commutation, communication and computing of optical signals without having to go through intermediate electronic stages.

One of the approaches proposed is based on a system wherein optical signals exist at all stages of signal processing with sufficiently high speed performance and simple configuration, preferably, by employing semiconductor components. Steady developments have been made in this direction during the last decade.

One such device is disclosed in an article by Tooley et al., "High Gain Signal Amplification in an InSb Transphaser at 77K", *Appl. Phys. Letter*, 43, 9, 807–809 (1983), comprising an optical nonlinear phase modulator with mirrors formed on an optically nonlinear semiconductor material, e.g., InSb (indium/antimony). It is possible, in this device which utilizes the optical nonlinearity of InSb, to obtain the effect of "the light by light" amplification by introducing two beams into InSb; a powerful beam for pumping and a weak one for carrying the data, resulting in the modulation of one beam with another and the amplification of the data-carrying optical signal(OS) up to 40 dB. This device is also known as a nonlinear Fabry-Perot interferometer (FPI). The advantages of this device include its small-sized design, high nonlinear factor and high gain factor. There exist, however, certain deficiencies in this device such as: the need for an external or outer pumping source; single input and single output channels; complicated input/output beams due to the structural peculiarities of the device; the necessity for complete frequency coincidence of the FPI and the input OS; and the device being essentially a laboratory mock-up whose practicality is still unknown.

The closest prior art device to the present invention, from the technical point of view, may be the invention entitled "Optical Transistor"; and described in U.S. Pat. No. 5,001,523 issued on Mar. 19, 1991, which is capable of commutating and amplifying optical signals as well as selecting the radiation of various frequencies by channels.

The advantages of this devices reside in its high amplification factor, the potential for commutation or switching of optical signals, its small-sized design, and the use of resonance rings as integral optic elements which permits the use of resonators with a high quality factor. There exist, however, certain deficiencies in this device including: limited channel accessibility, low sensitivity level for the input channels, output signals/beams which are highly divergent and circularly asymmetrical, and the lack of a multi-level system for the processing of the optical signals, i.e., lack of storage and logic capability.

SUMMARY OF THE INVENTION

It is, therefore, a primary object of the present invention to provide an active nonlinear optical transistor, which is controllable by input optical signals; is highly sensitive; is capable of generating narrow, circularly symmetrical and single mode output signals; and has the ability to carry out multi-level processing of optical signals as well as computing operations and storage functions.

In accordance with one aspect of the present invention, there is provided a nonlinear optical transistor, comprising:

an optical transistor (OT) including a waveguide and a pair of first mirrors, wherein the OT is confined by the pair of first mirrors in the horizontal direction, each of the first mirrors being located at each end of the waveguide;

a pair of surface emitting semiconductor laser diodes, wherein each of the laser diodes is located at each end portion of the waveguide and is confined by a pair of first multilayered mirrors in the vertical direction;

a pair of microcavities in the waveguide, each of the microcavities being located between the pair of first multilayered mirrors;

a phase modulator, including a Bragg grating, located between the pair of laser diodes;

a first pair of electrodes for regulating the electrical field in the phase modulator; and two second pairs of electrodes, each second pair of electrodes controlling each of the laser diodes.

To achieve those above stated objects, the present invention incorporates a Fabry-Perot microcavity having a vertical optical axis by utilizing a plurality of Bragg reflectors, wherein the surface coatings are applied to the input faces to thereby increase the reflection index to 1.0, the grating of Bragg reflectors is located above the phase modulator waveguide, and the reference electrode is formed on the bottom base.

The creation of an Fabry-Perot inteferometer in conjunction with the increasing of the degree of the face mirror's reflection to 100% and the forming of the feedback in the phase modulator, and the integration of the Fabry-Perot interferometer having a horizontal optical axis with the vertical microcavity in a mutually active medium controlling the phase modulator, permit the present invention to exhibit the above-mentioned properties.

BRIEF DESCRIPTION OF THE DRAWINGS

The above and other objects and features of the present invention will become apparent from the following description of the preferred embodiments given in conjunction with the accompanying drawings, wherein.

DETAILED DESCRIPTION OF THE PREFERRED EMBODIMENTS

Figure 1A:
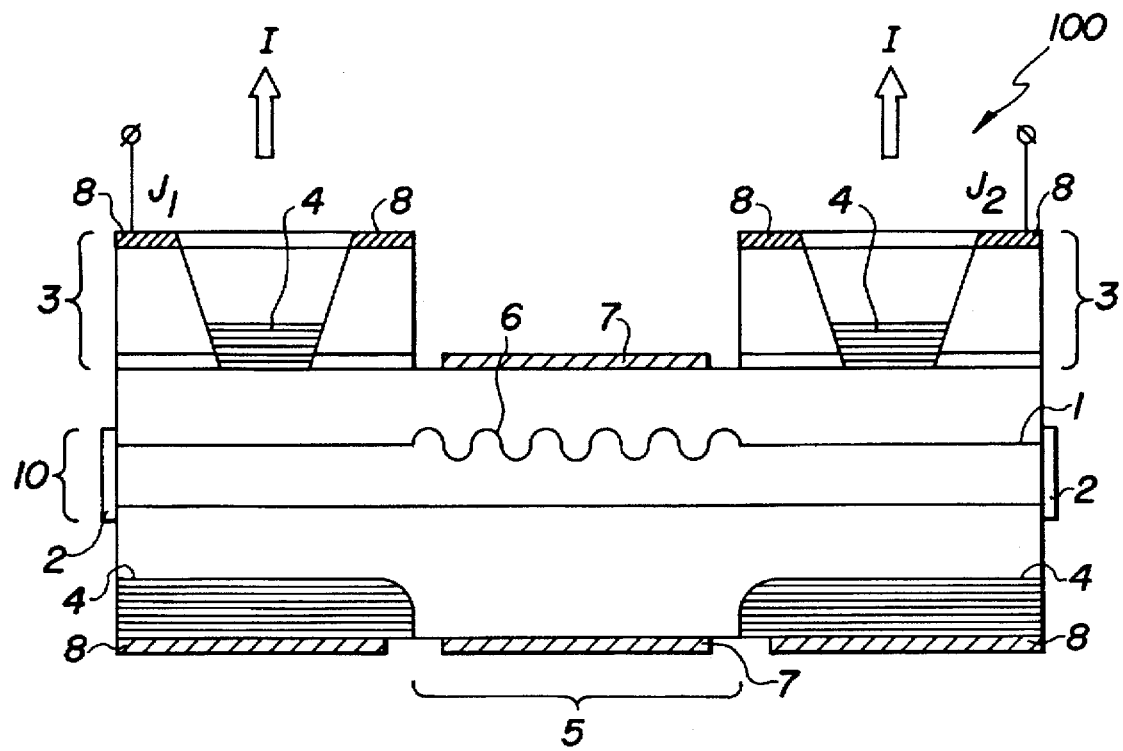
FIGS. 1A and 1B represent a cross sectional and a top view of a nonlinear optical transistor in accordance with a preferred embodiment of the present invention, wherein $J_1$ and $J_2$ represent the pumping current for each of the pair of semiconductor lasers, respectively.

The optical transistor (OT) basically allows the commutation/communication of optical signals (OS) with amplification of the OS or memorization of the OS as a function of the choice of the appropriate device characteristics and of the control signals applied to the electrodes. OT functions and characteristics are disclosed more fully in an article by Lomashevich et al., "Concept of Optical Transistor", *Journal of Applied Spectroscopy*, 55, 3, 485–490 (1991) and in USSR Inventor's Certificate No. 1225386, entitled "Optical Transistor" issued to Morozov et al.

In the present invention, the OT is defined by two semiconductor lasers and a phase modulator (PM) placed between the lasers to constitute the first non-linear cascade of amplification operating in the optical bistability (OB) mode. When an OS enters the PM of the OT and the light intensity exceeds a threshold value, anti-reflection or saturation of the OT takes place due to the non-linear properties of the material tuning to the resonance. If the dependence $n=n_0+n_2I_p$ (where $n_0=$the "dark" refractive index, $n_2=$the non-linearity factor, and $I_p=$the intensity in the resonator) is implemented, then upon attaining the threshold value of $I_p$, the influence of the addend becomes considerable, and the system automatically starts to tune toward and to resonance. This process arises in a rapid or avalanche-like manner and the characteristic is realized with large and substantial steepness to thereby provide the desired amplification factor at the very beginning or the first stage of the processing of the OS.

As the PM serves as a non-linear Fabry-Perot interferometer (FPI) with a resonator incorporated therein, its optical path depends on the intensity of integrated radiation. The PM changes the optical length of the resonator in the OT and also changes its Q-factor, which leads to the change of the threshold current. Such re-tuning allows the device to pass through the generation threshold, i.e., to obtain a lasing or laser mode.

According to the OT concept, the first amplification cascade (i.e., the PM) basically realizes the function of matching; without the requirement for strict coincidence of the input signal and resonator frequencies, it allows to evoke such a response of the whole system so that under the influence of the input signal, i, amplified in the PM: $I=G_1i$, and of the signal which has passed through the feedback circuit and has been amplified in the semiconductor laser amplifier (SLA): $I=G_0G_1i$, the refractive index of the resonator of the optical transistor changes, which finally gives the below presented function of the optical transistor:

$$I = \frac{Gi}{1+(\tau_{OT}I-\theta_0)^2} \qquad \text{Eq. (1)}$$

wherein $$\tau_{OT} = 1 + \frac{G_0}{1+(I-\theta_0)^2}$$

=the OT transmission characteristic,
i=the input intensity,
I=the output intensity,
$G_0=$the inner gain factor of the OT,
$G_1=$the gain factor for the PM=$3/(3-\theta_1^2)$,
$\theta_0=$the phase angle for detuning of the optical transistor, and
$\theta_1=$the phase angle for detuning of the phase modulator.

Additional proposals relating to the OT concept are disclosed in an article by Lomashevich et al., "Concept of Optical Transistor" *Journal of Applied Spectroscopy*, 55, 3, 485–490 (1991).

The microcavity of the surface radiating laser diode, as disclosed in an article by Kinoshita et. al., "Circular Buried Heterostructure GaAlAs/GaAs Surface Emitting Lasers", *IEEE Journal of Electronics*, QE-23, 6, 882–888 (1987), permits to extract the OS, formed by a nonlinear optical transistor (NL OT), in a vertical direction, the active space of the laser diode being the active space of the laser in the OT. The mirrors in the OT, having the reflective index of 100%, restrict the radiation output from the faces of the OT. The radiation is captured by the microcavity mirrors, stimulating the radiation in a vertical direction through the upper mirrors.

The transfer ratio of the nonlinear FPI with respect to the value of the output intensity can be represented, as disclosed in an article by Lomashevich, S.A., "About Problem of Direct Amplification & Communication of Optical Signals", *Electrocommunication*, 11, 14–17 (1992), as:

$$\tau_{MR} = \frac{1}{1+(I-\delta_0)^2} \qquad \text{Eq. (2)}$$

wherein $\delta_0$ is the phase angle for initial detuning of the interferometer (MR).

In the NL OT, the formation of the output OS is realized by using two resonators, namely, FPI and MR, both of which operate in a nonlinear regime exhibiting OB. In this case, the output OS, I, as a function of the input OS, i, can be expressed as:

$$I = \frac{G_i}{1+(\tau_0I-\theta_0)^2} \qquad \text{Eq. (3)}$$

wherein $$\tau_0 = \tau_{OT}\tau_{MR} = \left[1+\frac{G_0}{1+(I-\theta_0)^2}\right]\left[\frac{1}{1+(I-\delta_0)^2}\right]$$

The Eq.(3) fully describes the functional possibilities of the NL OT.

The effect of OB manifests itself in nonlinear media in which the index of refraction, n, is a function of and is dependent upon the intensity (i.e., the intensivity) of the optical energy in the media, $n=n_0+n_2I_p$, and at the feedback present in the system. In the disclosed device, both the optical system as a whole (made of one and the same material exhibiting dispersion or absorption non-linearity and nonlinear circular resonator-operated feedback) as well as its individual elements, e.g., the PM, FPI and MR, in which the feedback is provided by the outer mirrors, meet the above requirements. See also Bystrov et al., "Optical Transistor as a New Functional Element of FOSCIT Technique", *Electrocommunication*, No. 1, 22–25 (1992). It is critical for the operation of the disclosed device that the initial response of the system to the input radiation, taking place in the input OT, occurs in accordance with stalling, and, consequently, rapidly in time (on the order of picoseconds), and with very steep characteristics. Further, formation of the output signal is also effected by the system operating in the OB mode. The sequence of preliminary amplification, amplification and power amplification is a simplified way of characterizing the successive formation of the output signals in the system.

Figure 1B:
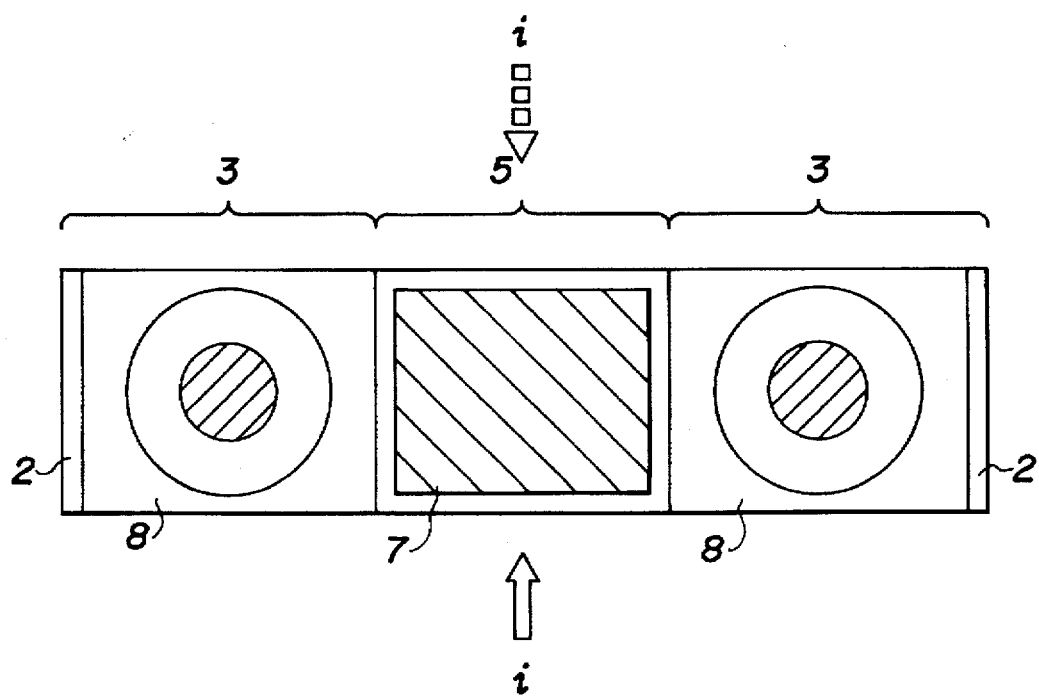

In FIGS. 1A and 1B, there are illustrated cross sectional and top views of the inventive NL OT 100 which is comprised of: an OT 10 including a waveguide 1 and a pair of first mirrors 2, wherein the OT 10 is confined by the pair of mirrors 2 in the horizontal direction, each of the first mirrors 2 being located at each end of the waveguide 1; a pair of surface emitting semiconductor laser diodes 3, wherein each of the laser diodes 3 is located at each end portion of the waveguide 1, and is confined by a pair of first multilayered mirrors 4 in the vertical direction; a pair of microcavities in the waveguide 1, each of the microcavities being located between the pair of first multilayered mirrors 4; a PM 5, including a Bragg grating 6, located between the pair of laser diodes 3; a first pair of electrodes 7 for regulating the electrical field in the PM 5; and two second pairs of electrodes 8, each second pair of electrodes 8 controlling each of the laser diodes 3.

Figure 3:
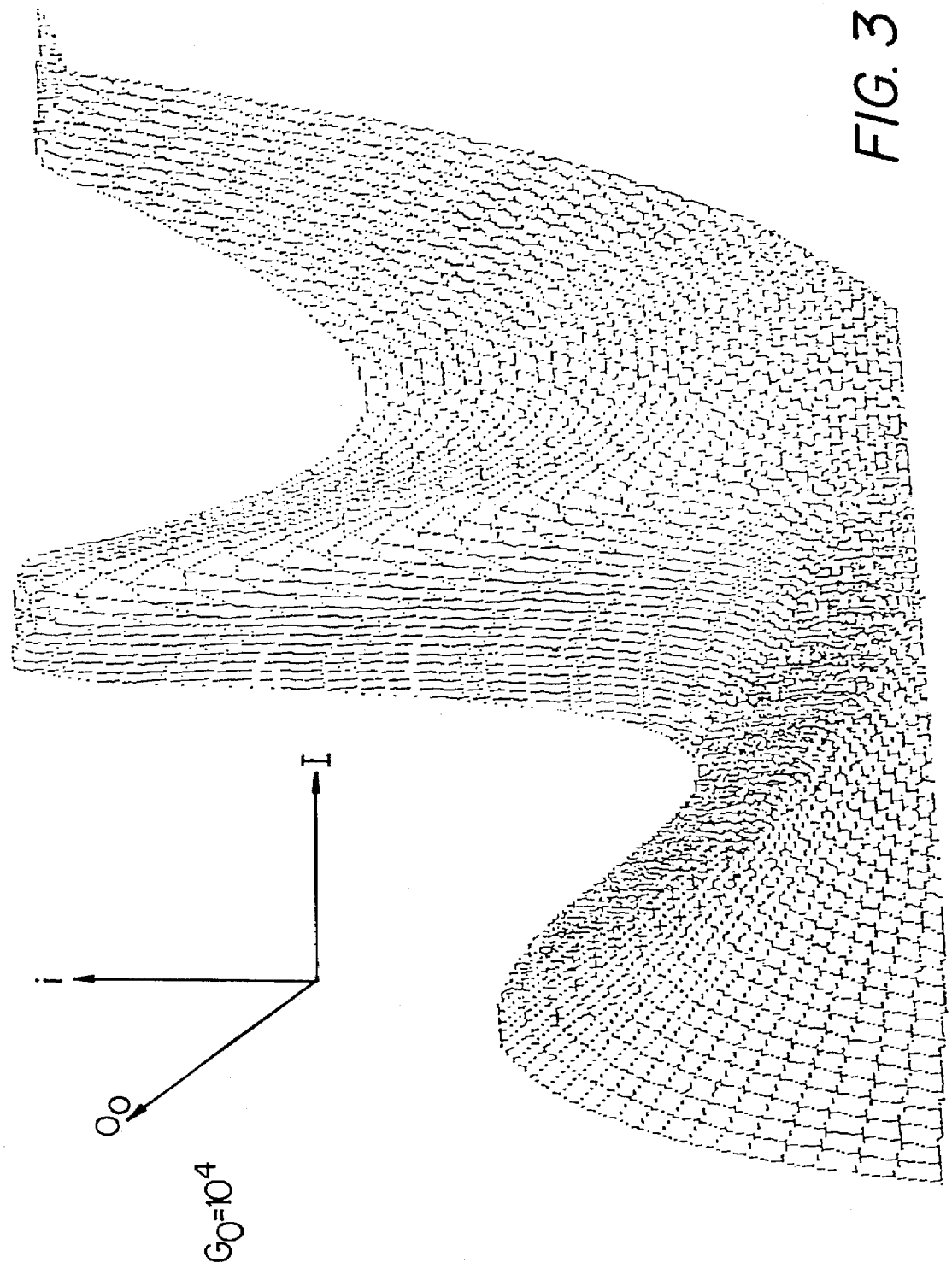
FIG. 3 exhibits the bifurcational surface showing i as a function of I and $\theta_0$ at $\delta_0=1.53$ and $G_0=10^4$.

In order to operate the inventive system, the pumping currents, $J_1$ and $J_2$ (FIG. 1A), of the lasers 3 are chosen in such a way that the intensity of optical radiation in the PM 5, which is in fact equivalent to that of the whole system, does not exceed some threshold value of the intensity of the nonlinear effect in the material making up the PM 5. Initially the resonator in the OT 10 is in the state of detuning to the resonance, this being the "lowest" state of the output intensity (FIG. 3). When light intensity exceeds some threshold value (i.e., because of an increase in laser radiation, adjustment of the PM 5 to resonance, or a change of the refractive index due to a change of the electric field strength in the region of the PM 5), then anti-reflection or saturation of the PM 5 takes place due to the nonlinear properties of the material, i.e., tuning toward and to resonance. If the dependence $n=n_0+n_2I_p$ is implemented, then upon attaining the threshold value of $I_p$, the influence of the addend becomes considerable, and the system automatically starts to tune toward resonance, this process proceeding in a rapid and avalanche-like manner due to the high Q-factor of the resonator in the OT and the feedback in the optical transistor provided by the pair of first mirrors 2. The radiation changes its optical length nL (L is the distance between the first mirrors 2) in the direction of resonance; the inner field $I_p$ increases which, in turn, causes still greater change of the refractive index, increases nL, and the system quickly moves toward and to the resonance state. During this process, an increase of $I_p$ results in an increase of the optical field in the lasers 3 due to the light injection, a decrease of carrier density, an increase of the refractive index in the active region of the lasers which upsets the laser into the mode of stimulated radiation, which, in turn, causes still greater enlargement of the power of the light field in the system.

In the initial state, the FPI and the OT 10 are detuned, and the integrated power of the lasers 3 is not enough to exceed the threshold for causing nonlinear effects, while the value of the outer OS turns out to be enough to cause the above-described process of the changing of properties of the PM 5 and the system as a whole which finally results in a transition of the system into the "highest" light-intensity state. It should be noted that, since the PM-FPI is optically bistable and has feedback through the first mirrors 2, the pumping of the energy of the input signal, that is why from the very beginning of the system response (to the input disturbance) formation of the output signal is determined by stalling and highly steep characteristics, closed into a self-matching cycle: bistable stalling of the signal causes sharp increases of the intensity in the MR causing the above described consequences, but this increase of intensity is recognized by the surface radiating laser diode 3 as an increase in pumping intensity, i.e., as an event which still speeds up an upset into the "highest" state. Because of the increasing of the optical communication between the FPI and the MR due to the change of the refractive index the effect turns to be self-sustaining and accelerates or speeds up in the direction of the increase of the intensity inside the system.

The disclosed device can be used as a storage location or as an optical "triode" by appropriate control of its operating characteristics. The initial part of the characteristics in the region of high sensitivity is used in the considered case; retuning is effected by the electrical adjustments through the electrodes, i.e., by changing the electric field in the optical transistor or by controlling the current values in the lasers.

The "sharp" character of the increase of the light power accounts for high values of the amplification factor, viz., up to 40 dB. In devices with stalling mechanisms of operation, the real steepness of the characteristic is limited by the fundamental processes, i.e., relaxation of the medium (with time of the order of $10^{-12}$ to $10^{-13}$ seconds), dissipation of energy, fluctuations of the optical field in the resonator, plus imperfections present in real resonators.

In the present invention, there are four parameters (G, $G_0$, $\theta_0$, $\delta_0$) influencing the shape of nonlinear OT characteristics. Of those four parameters, the most important ones are $G_0$, the coefficient of internal amplification (the internal gain), $\theta_0$, the phase angle for detuning of the OT 10; and $\delta_0$, the phase angle for initial detuning of the microcavity.

Figure 2:
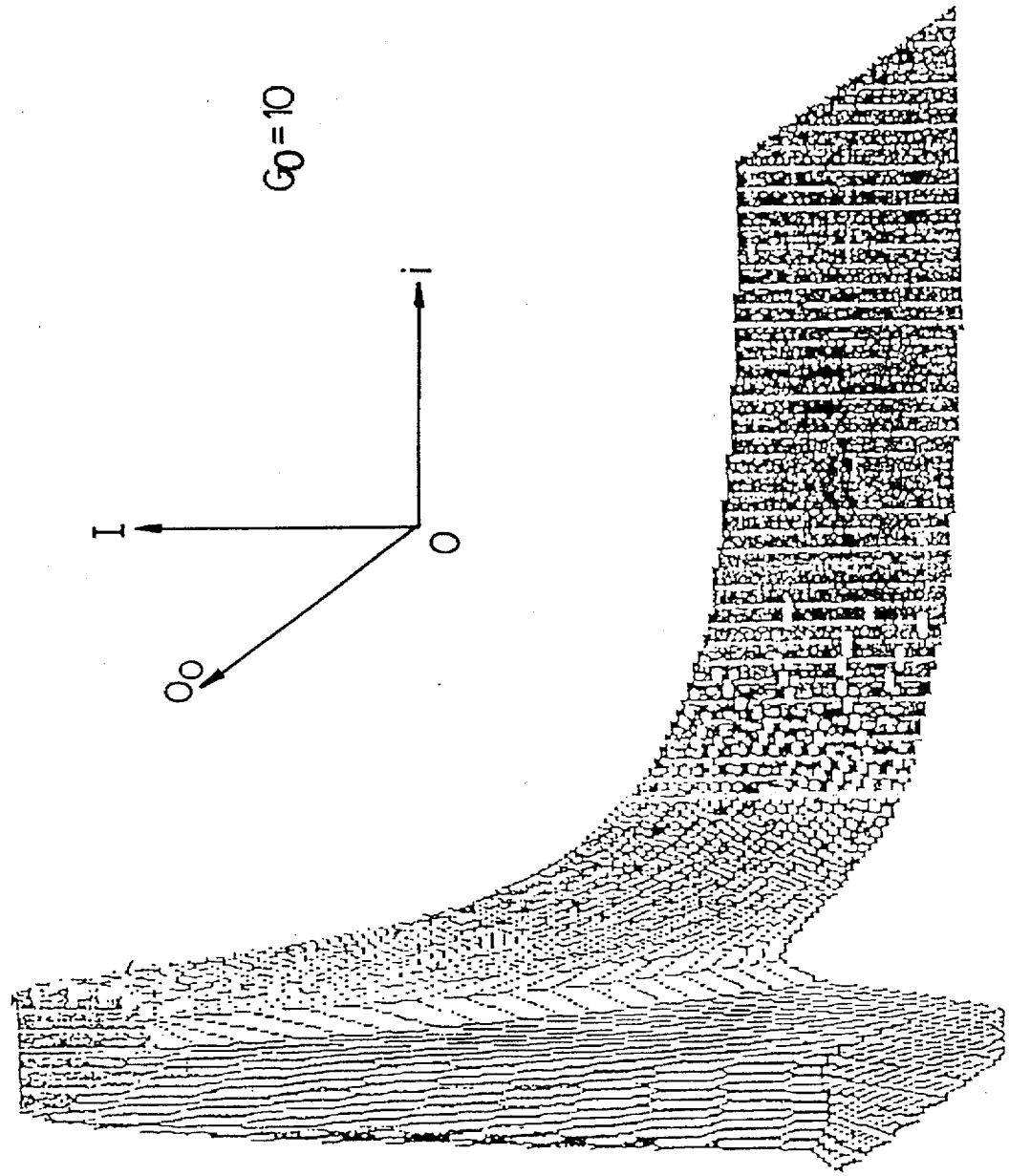
FIG. 2 represents the bifurcational surface showing i as a function of I and $\theta_0$ at $\delta_0=1.53$ and $G_0=10$.

Values for these parameters can be modified in the following manner: $G_0$, by changing the laser pumping current $J_1$ and $J_2$; $\theta_0$ by changing the PM voltage; and $\delta_0$, by changing the level of electrical pumping, i.e., by changing the concentration of carriers in the active space. A wide range of bistable characteristics with the steep slope for square hysteresis loop can be realized by changing $G_0$ while holding other parameters, G, $\delta_0$ and $\theta_0$, constant. FIGS. 2 and 3 represent the bifurcational surface showing i as a function of I and $\theta_0$, at $\delta_0=1.53$ and $G_0=10$, and at $\delta_0=1.53$ and $G_0=10^4$, respectively. It can be determined from these figures that by changing the internal gain, $G_0$, it is possible not only to readjust the NL OT functionally, but also possible to adjust the degree of brightness in the OB regime, the input OS value being used for controlling the system and the output OS value constituting the response of the system.

Figure 4:
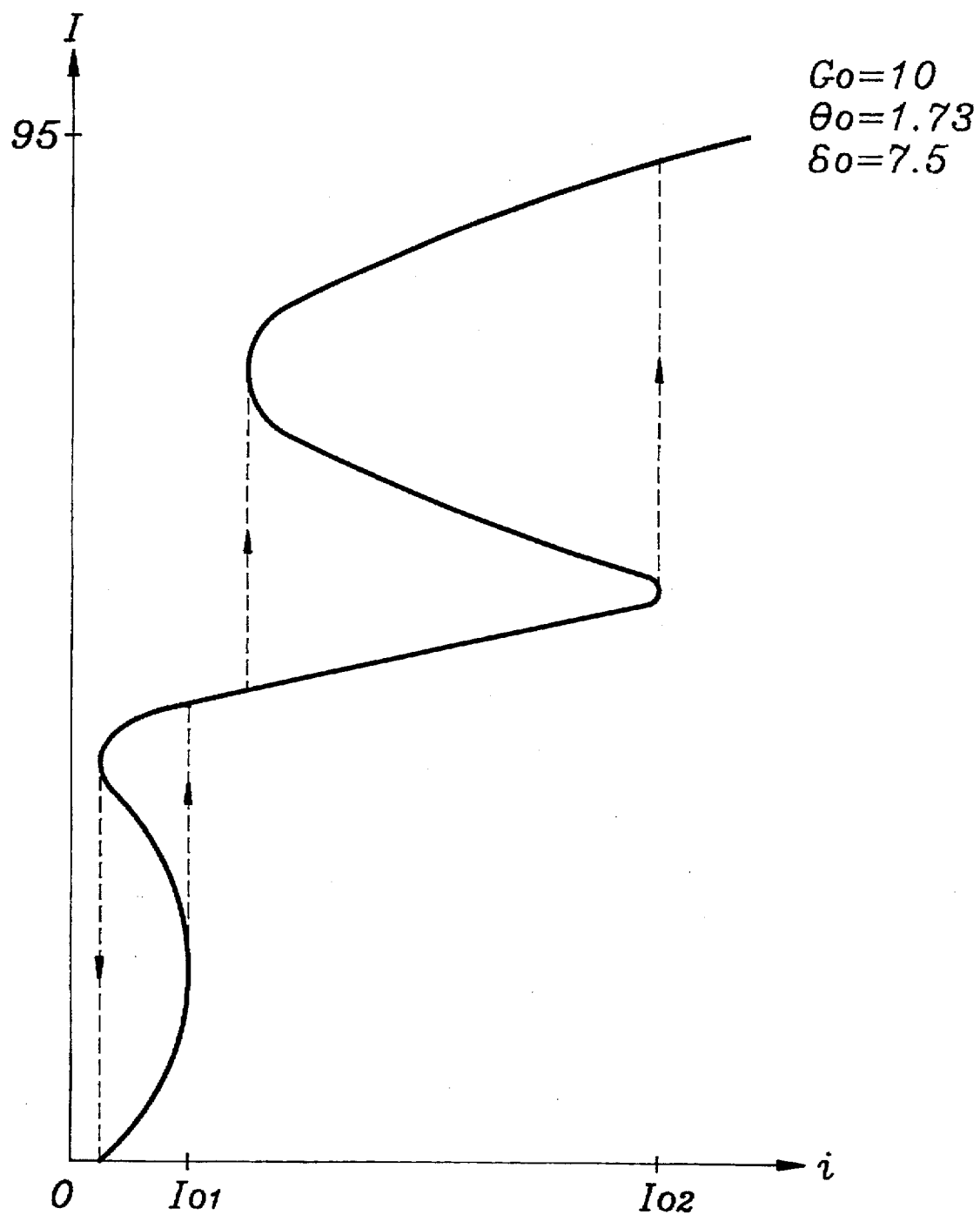
FIG. 4 depicts the multistable characteristics at $G_0=10$, $\theta_0=1.73$ and $\delta_0=7.5$.
Figure 5:
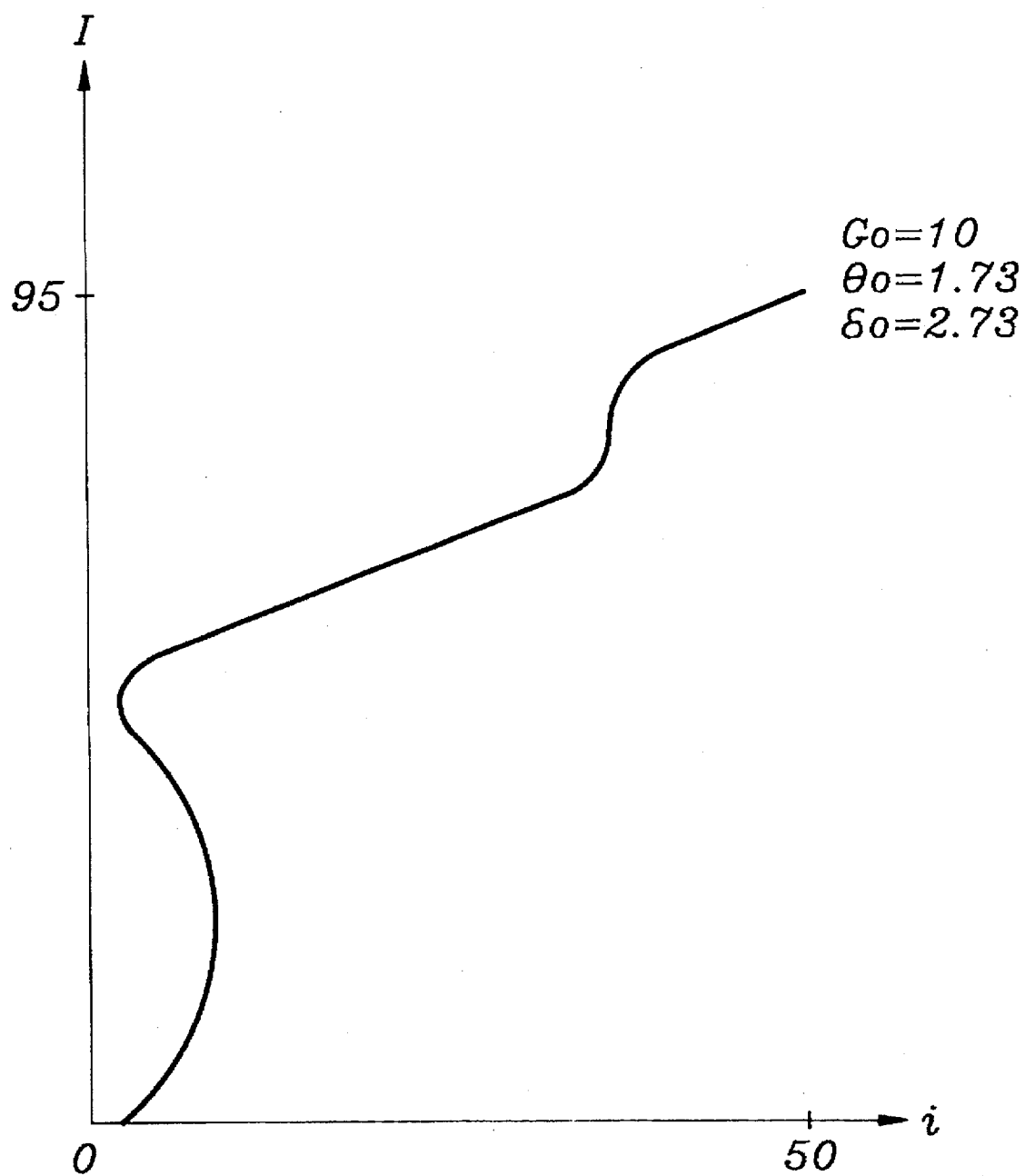
FIG. 5 describes the nonlinear optical transistor characteristics at $G_0=10$, $\delta_0=2.73$ and $\theta_0=1.73$.
Figure 6:
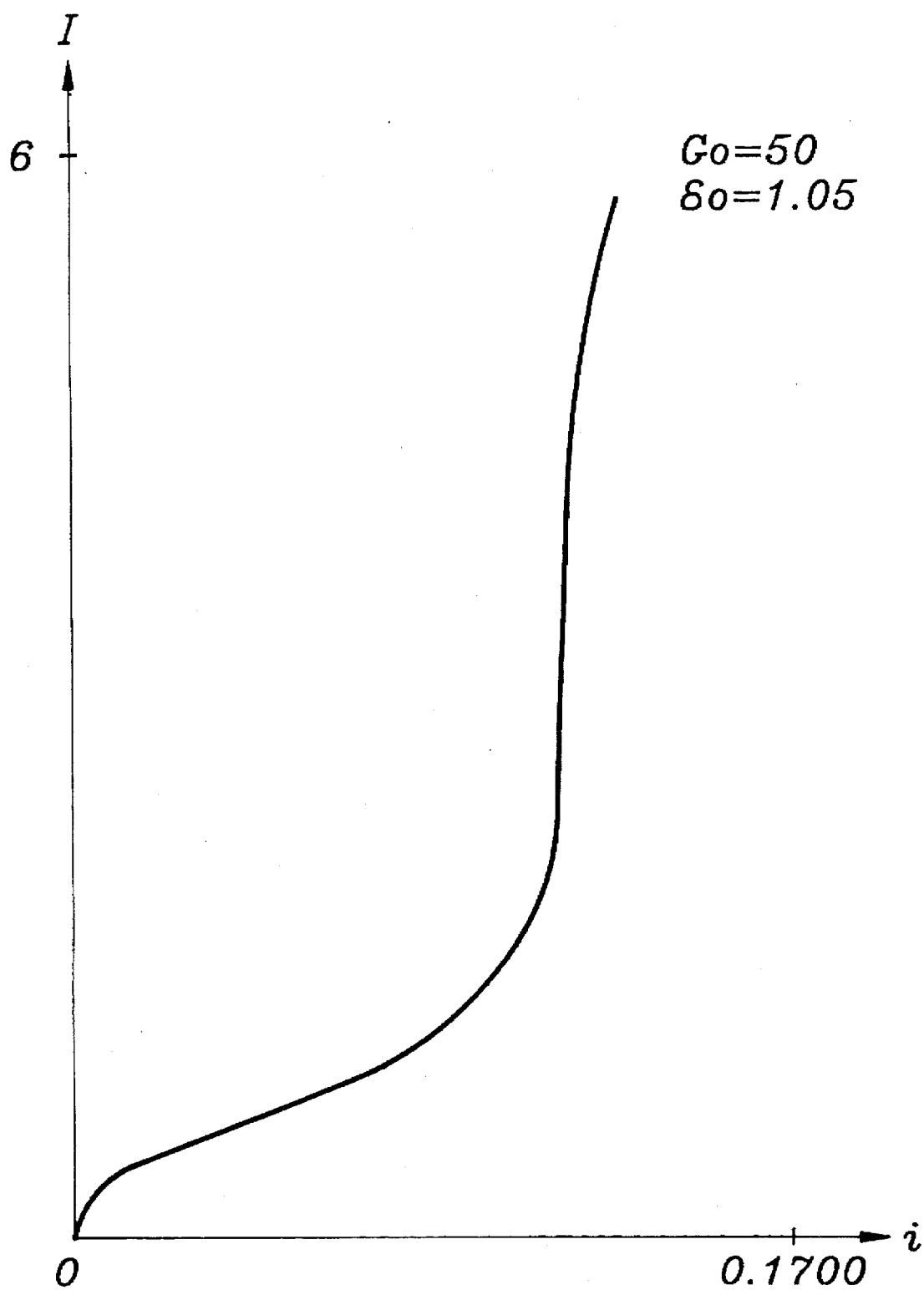
FIG. 6 presents the differential amplification at $G_0=50$, $\theta_0=1.18$ and $\delta_0=1.05$.

As shown in FIGS. 4 and 5, various functions of the NL OT are being carried out by changing $\delta_0$ and $\theta_0$ while holding $G_0$ constant. FIG. 4 shows the OB of two orders, the first and the second. It allows the NL OT not only to carry out the storage function and the selection and storage of the OS having different intensities but also the operation of coincidence of two OS entering the system simultaneously by utilizing the optical bistability of the second order.

In FIG. 5, there are illustrated the OB of the first order permitting the NL OT to carry out the storage function and the OB of the second order permitting the differential amplification. The low level differential amplification mode at $G_0=50$ is realized by holding $\theta_0=1.13$ and $\delta_0=1.05$. This is same as the triode mode-amplification and bifurcation (switching) of OS between channels.

Figure 7:
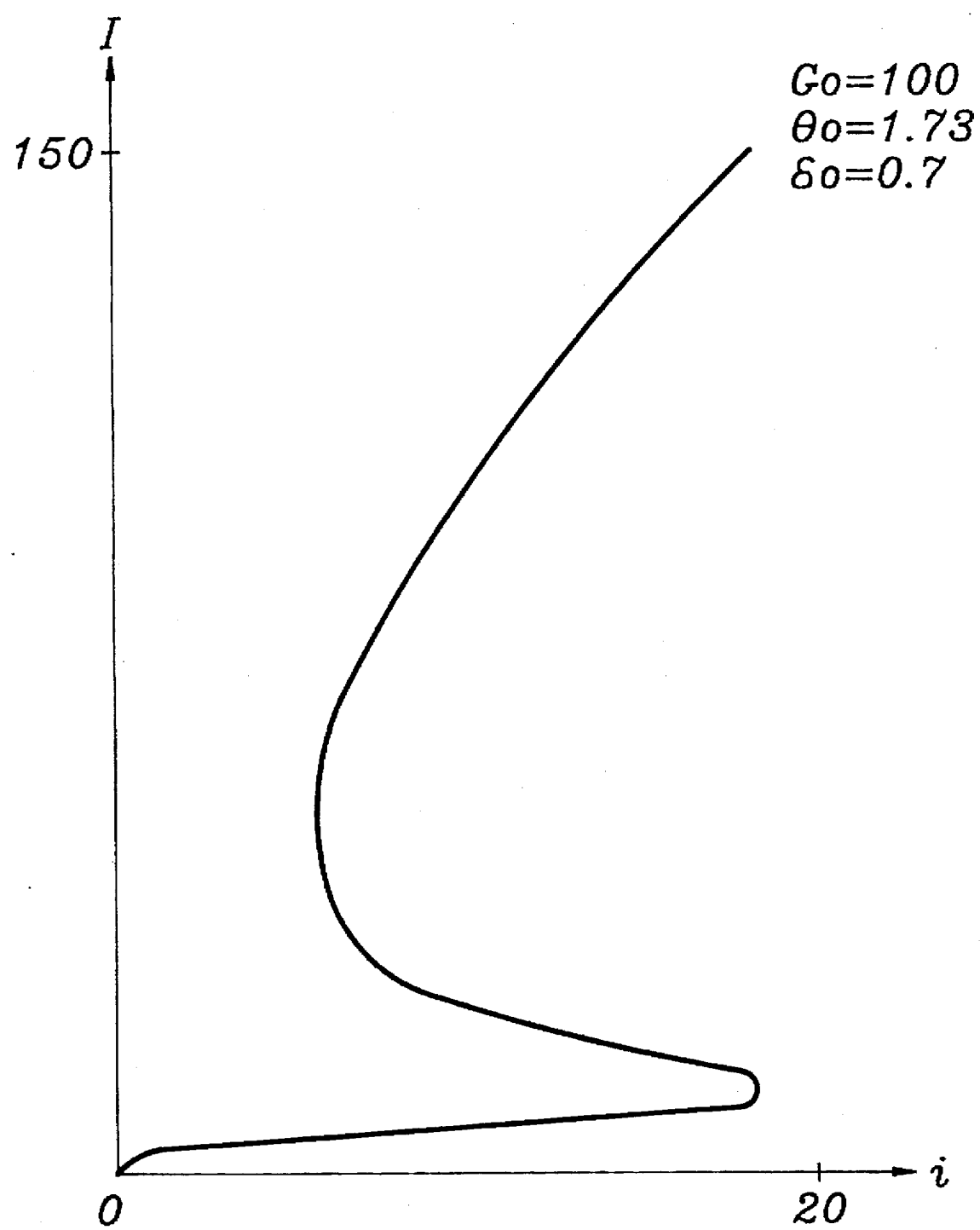
FIG. 7 provides the optical bistability characteristics at $G_0=100$, $\theta_0=1.73$ and $\delta_0=0.7$.
Figure 8:
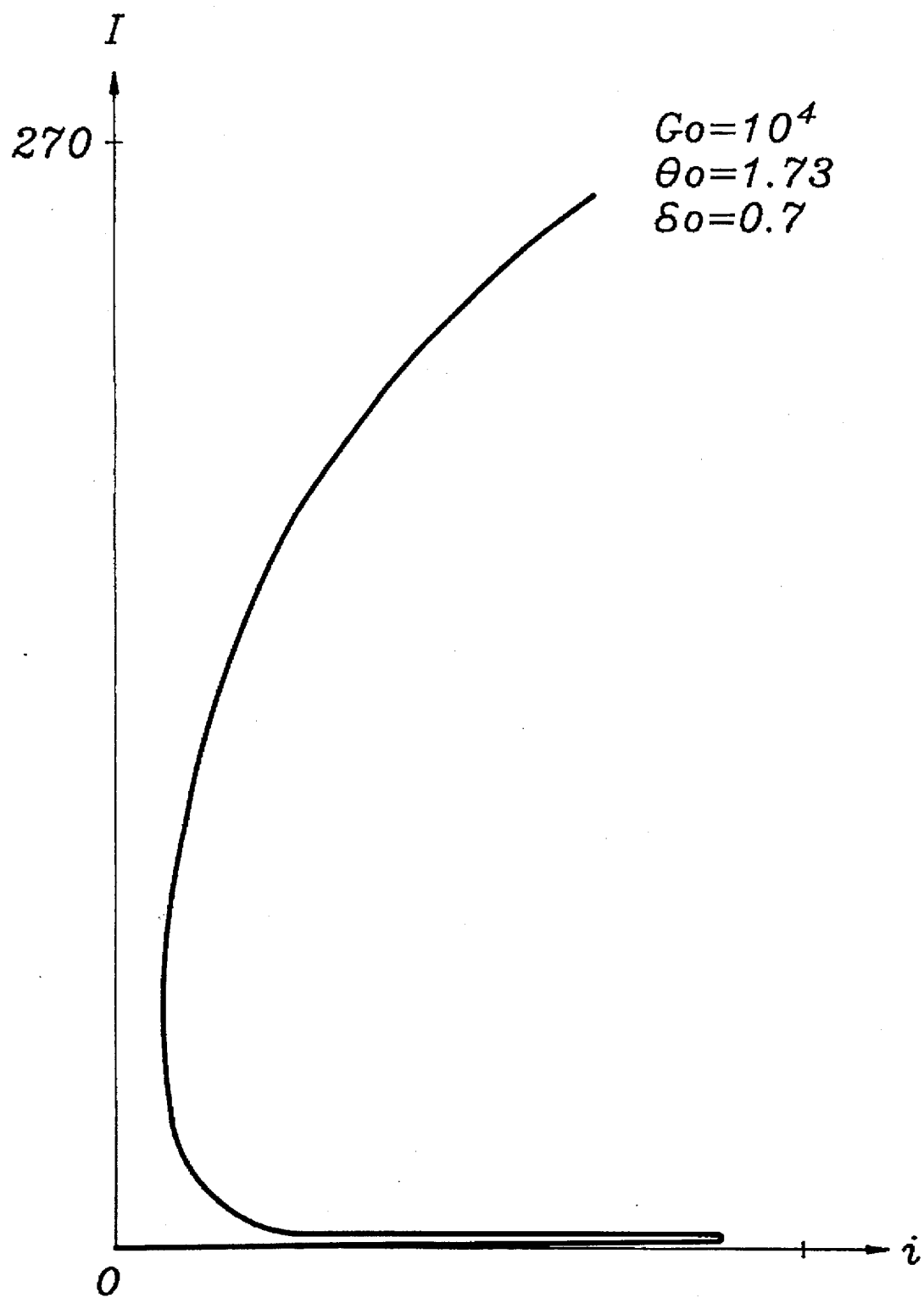
FIG. 8 is the optical bistability characteristics at $G_0=10^4$, $\theta_0=1.73$ and $\delta_0=0.7$.

Increasing of the interval gain, up to $10^2$ in FIG. 7 and up to $10^4$ in FIG. 8, results in obtaining of the optical bistability characteristics with large square hysteresis which is essential for designing an output signal storage device and also for designing an optical storage table with respect to the optical field interval fluctuations and interferences.

The OB characteristics can be altered widely by changing the value of $G_0$ while holding $\delta_0$ and $\theta_0$ constant as shown in FIGS. 7 and 8, indicating a possibility of using a NL OT as a booster output device capable of commutating the OS.

To summarize, the input OS, i, which enters one of the two optical contacts (or both of them simultaneously) causes the initiation of the PM 5, wherein the feedback is provided by the Bragg lattice and the laser beams from the lasers 3 are optically coupled, will in turn lead to increasing of the optical intensity in the FPI and the coinciding of resonance thereof with the input OS frequency. As a result, the optical field in the active area will increase and force the lasers into the laser generation mode.

When the resonance of the OT coincides with the input OS frequency, the laser beams from the pair of lasers will be captured and confined by the pair of first mirrors 2, i.e., the microcavity mirrors, the material making up the system will exhibit the nonlinear properties, and there will be a sharp increase in the internal optical field in the system. The amplified signal I is emitted through the multilayered mirrors 4, i.e., the output mirrors, as shown in FIG. 1. In the storage mode, the system is switched to the "highest" light-intensity state, as shown in FIGS. 4 and 5.

Thus, the input OS, i, entering one of the two optical contact, causes anti-reflection or saturation of the PM 5, as limited by the first pair of mirrors 2, of the OT 10, tuning of the PM 5 to the resonance state, and, as a consequence, causes tuning to the resonance of the OT 10, an increase of the radiation of the lasers 3 of the OT 10, an increase of the optical field in the region of the OT 10 and the electrically active optical bifurcation (BOA), pumping of energy in the MR which finally initiates nonlinear effects in the material making up the MR, retuning to the resonance of the MR, switching of the OT lasers into the laser generation mode, amplification of the OS; then a still greater increase of the optical field in the MR follows, this disturbance via feedback circuit goes back to the BOA and the OT, and so on, the sequence of events continuing to reoccur. As a result, an amplified signal I is radiated at the output port.

Representative materials used for the manufacture of the disclosed device a three-component system (for example, GaAlAs) and a four-component system (for example, InGaAsP) solid solutions, compositions of which depend on the range of overlaying wavelengths of optical radiation. Technical processes for the fabrication of the optical processor include liquid, gas-phase, moshydrate and molecular-beam epitaxy.

Design and structures of the active cells of the optical processor in its combined (hybrid) version can be manufactured using the above mentioned technological processes; and may be installed into etched windows in the circular resonator and waveguides using an In-based solder.

As to the integrated-optical version, the following structures are proposed. For lasers on the double heterostructure, the most simple variant is implemented by generation of an active layer distributed over the active space. Vertical formation of the active layer occurs together with the heterostructure growth; planar-wise the active layer is limited by the size of contact pads, which repeat the form of the elements of the processor. Alternatively, the limitation can be implemented by manufacturing a narrow active layer in an immersed masked heterostructure. In the integrated-optical version, mirrors may be manufactured in the form of distributed feedback using the process of holographic lithography accompanied by chemical etching. The above designs can be implemented using quantum-sized structures.

The main advantages of the inventive device are as follows: the ability to carry out amplification of OS and radiation thereof at the plane perpendicular to the input beam plane; the ability to control various functions of the NL OT using parameters determined by the dependent relationship $i=f(I, G_o, \theta_o, \delta_o)$ and desirably subordinated to electric control via the electrodes of the device; the manner by which input OS are introduced into the PM of the OT avoids the strict coincidence of OS frequencies and tuning frequencies of FPI in the OT; a high amplification factor (above 40 dB), high responsivity; ability to generate narrow, circularly symmetrical and single mode output signals; and a wide dynamic range in the output OS intensity when $G_o$, the internal gain of the OT, is greater than or equal to $10^2$.

While the present invention has been described with respect to certain preferred embodiments only, other modifications and variations may be made without departing from the scope of the present invention as set forth in the following claims.

What is claimed is:

1. A nonlinear optical transistor comprising:
   an optical transistor including a waveguide having a top, a bottom, and two opposite length ends, and a pair of first mirrors respectively located at each said opposite length end of said waveguide;
   a pair of surface emitting semiconductor laser diodes respectively located adjacent each said opposite length end of said waveguide, both of said surface emitting semiconductor laser diodes including a pair of multilayered mirrors respectively disposed above and below said top and bottom of said waveguide;
   a pair of microcavities respectively located between each said pair of multilayered mirrors;
   a phase modulator and a Bragg grating, both coupled to said waveguide and both located between said pair of laser diodes;
   a first pair of electrodes which regulate an electric field in said phase modulator; and
   two second pairs of electrodes respectively controlling each of said laser diodes.

2. A nonlinear optical transistor comprising:
   a waveguide having two opposite length ends and comprised of nonlinear material such that its optical length varies in accordance with radiation intensity of optical radiation confined therein;
   a pair of first mirrors respectively disposed at each said opposite length end of said waveguide, said first mirrors being adapted to confine optical radiation within said waveguide;
   a phase modulator coupled to said waveguide which is connectable to receive an optical signal having an input frequency and which produces optical radiation within said waveguide with an intensity corresponding to said input frequency;
   a lattice coupled to said waveguide and adapted to deflect out of said waveguide portions of said optical radiation confined in said waveguide by said first mirrors;
   a first microcavity disposed relative to said waveguide such that it captures said deflected optical radiation; and
   a first laser diode that communicates with said first microcavity and produces a first output signal when said optical radiation captured by said first microcavity reaches a first threshold intensity when said input frequency is a first predetermined frequency.

3. A nonlinear optical transistor according to claim 2, further comprising:
   non-linear active material which surrounds said optical waveguide and fills said first microcavity, said lattice being adapted to deflect said optical radiation into said active material.

4. A nonlinear optical transistor according to claim 3, wherein said first microcavity is defined by a pair of multilayered mirrors with said active material disposed therebetween.

5. A nonlinear optical transistor according to claim 2, wherein said lattice is a Bragg grating.

6. A nonlinear optical transistor according to claim 2, wherein said phase modulator is an optically bistable Fabry-Perot interferometer.

7. A nonlinear optical transistor according to claim 6, further comprising:

a second microcavity disposed relative to said waveguide such that it captures said deflected optical radiation; and a second laser diode that communicates with said second microcavity and produces a second output signal when said optical radiation captured by said second microcavity reaches a second threshold intensity when said input frequency is a second predetermined frequency.

8. A nonlinear optical transistor comprising:

a preliminary amplifier adapted to receive an optical signal having an input frequency and to produce optical radiation with an intensity corresponding to said input frequency, said preliminary amplifier including a phase modulator waveguide and a pair of opposing electrodes for regulating an electric field in said phase modulator waveguide;

a feedback stage having an optical length that varies non-linearly in accordance with optical radiation intensity, said feedback stage communicating with said preliminary amplifier so as to receive said optical radiation produced by said preliminary amplifier, said optical length varying in accordance with said intensity of said optical radiation so as to tune said optical radiation toward resonance, said feedback stage including an optical waveguide having two opposite ends and a pair of mirrors respectively disposed at each of said opposite ends, said mirrors being adapted to confine said optical radiation within said optical waveguide;

means for capturing said resonating optical radiation from said feedback stage; and a power amplifier that communicates with said capturing means so as to receive said resonating optical radiation, said power amplifier switching into an output generation mode to produce an amplified optical signal in accordance with a threshold intensity of said resonating optical radiation received from said capturing means.

9. A nonlinear optical transistor according to claim 8, wherein said phase modulator waveguide is an optically bistable Fabry-Perot interferometer.

10. A nonlinear optical transistor according to claim 8, further comprising:

non-linear active material surrounding said optical waveguide;, and a Bragg grating coupled to a portion of said optical waveguide, said Bragg grating being adapted to deflect said optical radiation into said active material.

11. A nonlinear optical transistor according to claim 10, wherein said capturing means includes a microcavity defined by a pair of multilayered mirrors with said active material disposed therebetween.

12. A nonlinear optical transistor according to claim 11, wherein said power amplifier includes a surface emitting laser diode.

13. A nonlinear optical transistor according to claim 8, wherein said power amplifier includes a surface emitting laser diode.

* * * * *